United States Patent
Ottobon et al.

(10) Patent No.: US 10,013,651 B2
(45) Date of Patent: Jul. 3, 2018

(54) ELECTRONIC MODULE WITH THREE-DIMENSIONAL COMMUNICATION INTERFACE

(71) Applicant: GEMALTO SA, Meudon (FR)

(72) Inventors: Stephane Ottobon, La Ciotat (FR); Jean-Christophe Fidalgo, La Ciotat (FR); Laurent Audouard, La Ciotat (FR); Frederick Seban, La Ciotat (FR)

(73) Assignee: GEMALTO SA, Meudon (FR)

( * ) Notice: Subject to any disclaimer, the term of this patent is extended or adjusted under 35 U.S.C. 154(b) by 184 days.

(21) Appl. No.: 14/441,088

(22) PCT Filed: Nov. 25, 2013

(86) PCT No.: PCT/EP2013/074630
§ 371 (c)(1),
(2) Date: May 6, 2015

(87) PCT Pub. No.: WO2014/082967
PCT Pub. Date: Jun. 5, 2014

(65) Prior Publication Data
US 2015/0269473 A1 Sep. 24, 2015

(30) Foreign Application Priority Data
Nov. 27, 2012 (EP) .................................. 12306467

(51) Int. Cl.
*G06K 19/077* (2006.01)
*H01L 31/18* (2006.01)

(52) U.S. Cl.
CPC . *G06K 19/07754* (2013.01); *G06K 19/07728* (2013.01); *G06K 19/07775* (2013.01); *H01L 31/18* (2013.01)

(58) Field of Classification Search
CPC ....... G06K 19/07754; G06K 19/07728; G06K 19/07775; H01L 31/18
See application file for complete search history.

(56) References Cited

U.S. PATENT DOCUMENTS 5,598,032 A 1/1997 Fidalgo
5,969,415 A 10/1999 Prancz
(Continued)

FOREIGN PATENT DOCUMENTS

DE    43 11 493 A1    10/1994
DE    195 00 925 A1    7/1996
(Continued)

OTHER PUBLICATIONS

International Search Report (PCT/ISA/210) dated Mar. 14, 2014, by the European Patent Office as the International Searching Authority for International Application No. PCT/EP2013/074630.
(Continued)

*Primary Examiner* — Sonji Johnson
(74) *Attorney, Agent, or Firm* — Buchanan Ingersoll & Rooney PC

(57) ABSTRACT

The invention relates to a method for making an electronic module having an integrated circuit chip connected to an antenna. The method includes the steps of producing a module having electrical interconnection areas, a chip connected to the interconnection areas and a protection element covering at least the chip and part of the interconnection areas, and a radio antenna connected to the chip and arranged above the chip. The method includes a step of producing the entirety or part of the antenna, or the tracks thereof for coupling same with the interconnection areas, in three dimensions directly on the protection element.

13 Claims, 2 Drawing Sheets

(56) References Cited

U.S. PATENT DOCUMENTS

| | | | |
|---|---|---|---|
| 2003/0025186 A1 | 2/2003 | Leduc et al. | |
| 2004/0154766 A1* | 8/2004 | Rancien | ................. D21H 21/48 |
| | | | 162/140 |
| 2006/0172458 A1* | 8/2006 | Droz | ................ G06K 19/07745 |
| | | | 438/107 |
| 2013/0105587 A1* | 5/2013 | Simske | ............ G06K 19/07749 |
| | | | 235/492 |

FOREIGN PATENT DOCUMENTS

| | | |
|---|---|---|
| EP | 0 671 705 A2 | 9/1995 |
| FR | 2 743 649 A1 | 7/1997 |

OTHER PUBLICATIONS

Written Opinion (PCT/ISA/237) dated Mar. 14, 2014, by the European Patent Office as the International Searching Authority for International Application No. PCT/EP2013/074630.

\* cited by examiner

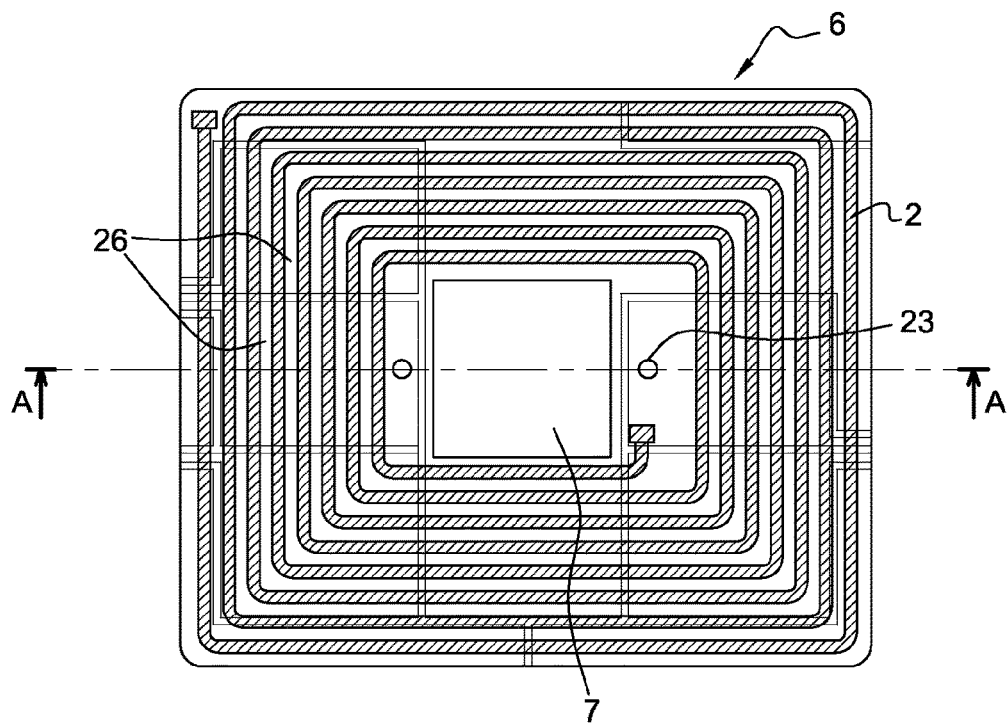
Fig. 1   "Prior Art"
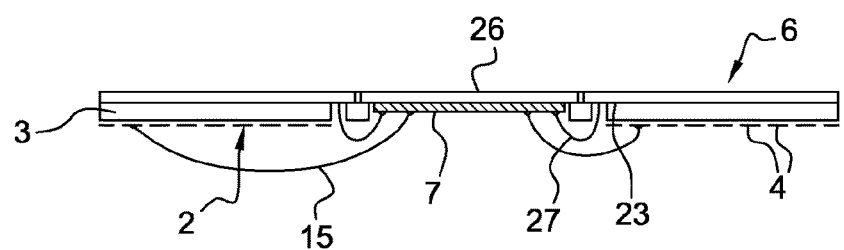
Line A-A   Fig. 2   "Prior Art"

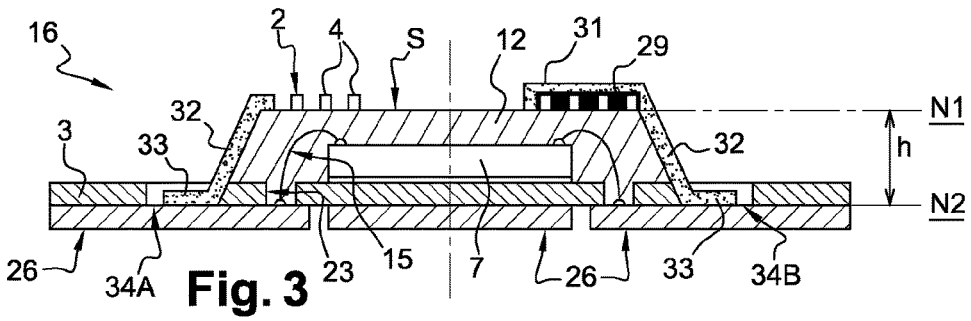
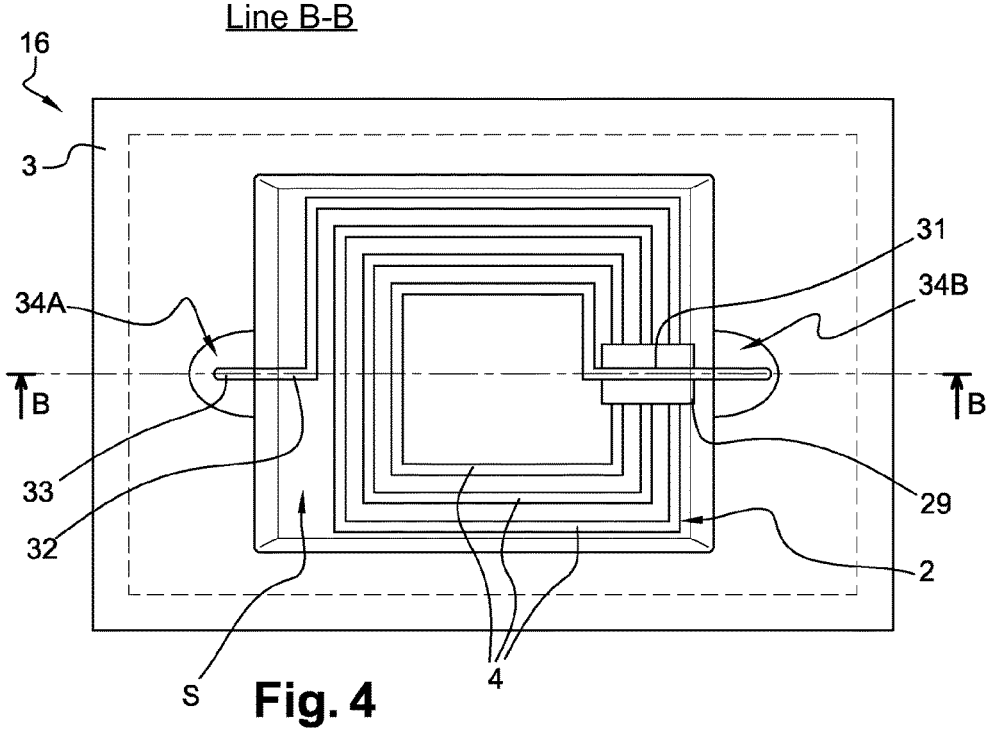
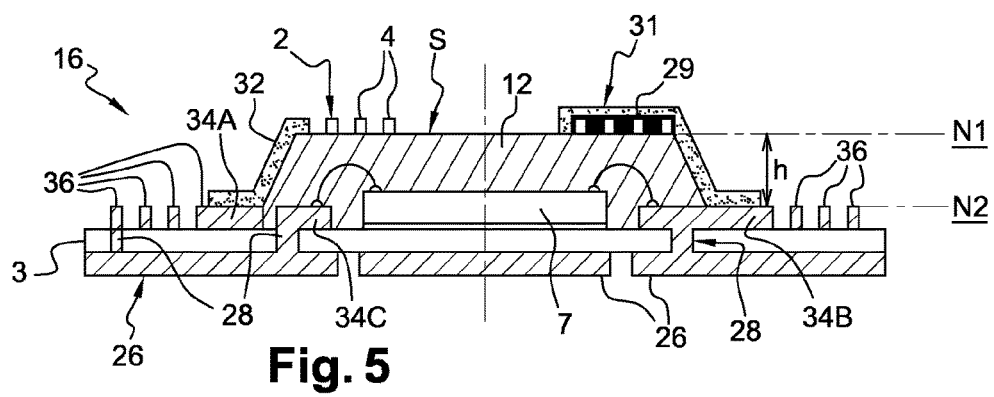

ELECTRONIC MODULE WITH THREE-DIMENSIONAL COMMUNICATION INTERFACE

FIELD OF THE INVENTION

The invention relates to an electronic module comprising an integrated-circuit chip connected to a three-dimensional communication interface in particular with a radio-frequency antenna.

The invention relates in particular to the field of electronic media such as chip cards with and/or without contact or hybrid cards, radio-frequency tickets or labels, radio-frequency transponders and inserts (or inlays) integrating or constituting such a module.

Such electronic media may in particular be in accordance with ISO/IEC 14443 or ISO 78016.

In a preferred application, the module may be of the hybrid type with an interface with electrical contacts and a radio-frequency antenna. The module of the invention may be simply a module with an antenna. It may also comprise a passive antenna or relays for increasing the range of the radio-frequency communication. The passive antenna and/or the module may preferably be placed in a chip-card body but also any other device, for example a telephone, in removable or soldered form.

PRIOR ART

Manufacturing a chip-card module by means of the steps corresponding to the preamble of claim 1 is known. Such modules are described in the patent FR 2743649 B1. The antenna, of the flat spiral type, is produced on one face of an insulating substrate while the other face may comprise an interface with electrical contacts.

The document DE-A-43 11 493 describes an assembly unit for manufacturing identification units to the card format. According to a first embodiment, a chip-card module comprises a support carrying an integrated-circuit chip. A wired coil fits on top of the chip at the rear of the module with contact so as to give the module a contactless identification capability. The antenna is probably produced (coiled) outside the module and then attached thereon. The surface area of the antenna is very limited and does not appear to allow communication of very long range. The use of the antenna in wired form, its attachment and its connection are not explained and do not appear to be easy.

Technical Problem

Substrates or modules of the standard double-face type as described in the patent FR 2 743 649, carrying communication interfaces with contact and with an antenna on their two opposite faces and with conductive interconnection vias are complicated and expensive to produce.

Furthermore, for optimum performances, each radio-frequency chip requires an antenna of specific design and consequently a specific double-face substrate that is dedicated to it. It is necessary to develop a different double-face substrate for each chip, and different stocks of substrates or modules therefore have to be managed according to each chip.

The aim of the invention is to reduce the costs or manufacturing steps while affording flexibility for adjusting the radio-frequency communication range according to the chips available.

SUMMARY OF THE INVENTION

The invention consists of adding an antenna or turns to a standard module, which may be single or double face. Preferably the additional turns are added by printing conductive material, jet of material, etc.

The subject matter of the invention is therefore a method for manufacturing an electronic module (16) comprising an integrated-circuit chip connected to an antenna, said method comprising the steps of:

producing a module comprising electrical interconnection areas, a chip connected to the interconnection areas and protection covering at least the chip and partly said interconnection areas, a radio-frequency antenna connected to the chip and disposed on top of the chip.

The method is distinguished in that it comprises a step of producing all or part of the antenna or its tracks for connection to the interconnection areas in three dimensions directly on the protection.

According to other remarkable features:
the antenna is produced by printing, in particular by jet of material or conductive ink jet;
the antenna extends partly over the protection (in particular a coating material) at a first level and partly on at least one flank of the protection as far as the interconnection pads/tracks situated at a second level different from the first level;
the interconnection tracks are connected to complementary antenna turns disposed on the insulating substrate;
the tracks are connected or constitute antenna turns complementary to the three-dimension antenna;
the three-dimensional antenna constitutes a relay antenna with respect in particular to a transponder contained at least partly in the coating material.

Another subject matter of the invention is a radio-frequency device comprising or constituting the module obtained according to the method.

BRIEF DESCRIPTION OF THE FIGURES

FIGS. 1-2 illustrate a chip-card module of the prior art respectively in plan view and cross-section along A-A;

FIG. 3 is a plan view of a module according to the invention;

FIG. 4 is a view in partial cross-section of FIG. 3;

FIG. 5 is a view in partial cross-section substantially like FIG. 3 but illustrating another embodiment with a metallised double-face module with complementary turns.

DESCRIPTION

In the drawings, the same references indicate identical or similar elements.

FIG. 1 illustrates an integrated-circuit chip-card module 1 of the prior art in plan view and in cross-section A-A. It comprises an antenna 2 on a dielectric or insulating substrate 3, in particular of the laminated lead frame type or of the etched type, and at least one integrated-circuit chip 7 attached to the insulating support or to the contact pad. The antenna 2 formed by turns 26 is here wound in a spiral on the substrate and substantially in the same plane.

The module also comprises connections 15 for connecting pins of the chip by wires soldered to interconnection areas (conductive tracks or pads, in particular of the electrical contact type) carried by the substrate. The module comprises a coating (not shown) of the chip and/or its connections by a coating resin, deposited in the form of drops. The chip is connected by wired connections passing through perforations 23 in the substrate.

In FIG. 3, the invention provides a method for manufacturing an electronic module 16 comprising an integrated-circuit chip 7 connected to an antenna 2 formed by turns 4 in a spiral.

The method provides a first step of producing a module 16 comprising electrical interconnection areas (pads/tracks), a chip 7 connected to the interconnection areas and mechanical protection 12 covering at least the chip and partly said interconnection areas.

The interconnection areas may constitute or form part of the electrical pads or tracks carried by the module. The insulating substrate here carries in the example electrical contact pads 26 on an external face opposite to the protection. The interconnection areas here form part of these pads. They appear through a recess in the substrate 3.

The protection is of the mechanical type and may in particular comprise or constitute a cap, a resin of the "dam and fill" type, in particular with UV hardening, having a resin ring and filling of the ring with another resin. The protection may comprise an insulating pellet disposed on the coating.

In order to obtain the best form of the turns or tracks, the preferred encapsulation method could be overmoulding or a drop of resin surmounted by a flat reinforcing pellet in order to obtain a flat top. However, a three-dimensional printing makes it possible to form an antenna on the standard top, in the form of a dome, a drop of resin and/or protection/encapsulation of the type where a ring is filled with resin (dam & fill).

In the example, mechanical protection is obtained by a coating 12 obtained preferably by overmoulding and/or so as to have a top surface of the coating S that is substantially flat.

To enable connection of the antenna 2 with the interconnection areas, the angle of the slope of the protection may be correctly defined. After the overmoulding, this parameter is defined by the form of the mould.

According to a second step of the method, a radiofrequency antenna 2 connected to the chip and disposed on top of the chip is produced (opposite to the contact pads) along Y in the reference frame XYZ in FIG. 3 so as to have the chip between the antenna 2 and the contact pads 26.

According to one feature of this embodiment, the method comprises a step of producing all or part of the antenna (2) in three dimensions or all or some of its tracks (32) for connection to the interconnection areas 34A, 34B, directly on the protection 12 of the chip 7.

Three-dimensional antenna 2 (in three dimensions) means that all or part of an antenna is produced on several levels N1, N2 along the Y-axis perpendicular to the contact pads, preferably by printing or distribution of conductive material in particular by ink-jet head orifices or nozzles with continuous jet or dropwise on demand according to a piezoelectric or thermal technology or by valve.

Part of the antenna can be produced directly on the module (for example by spraying) while a part may be attached (for example on a pellet or cap).

In the example, the antenna 2 extends partly over the protective material 12 at a first level N1 and partly on at least one flank of the protective material as far as the interconnection pads/tracks 34A, 34B situated at a second level N2 different from the first level, following a difference in level h.

The difference between the extreme levels N1, N2 (or difference in level h) is for example between 0.2 and 0.6 mm. In the embodiment in FIG. 3, this difference in level could in reality be 0.55 mm (for a module 0.58 mm thick minus the thickness of the copper metallization on the contact face of approximately 0.030 mm). And in the embodiment in FIG. 5, this difference in level could in reality be 0.38 mm (for a module 0.58 mm thick minus the thickness of the double-face film of approximately 0.2 mm).

Still in FIG. 3, in the example, the turns 4 of the antenna 2 are produced on the flat top (S) of the protective coating 12 and the connecting tracks of the antenna extend over a lateral slope of the coating (or flank of the coating), as far as the interconnection areas/pads/tracks 34A, 34B, 26 of the antenna. The top (S) may however not be flat, such as a rounded part or in the form of a crater.

The interconnection areas 34A, 34B of the antenna are here implemented by a portion of a surface situated on the reverse side of the contact pads such as the pad 26 of the module. This portion is accessible through an opening or perforation in the supporting film 3.

The chip is connected to contact pads/interconnection areas by openings/perforations 23 in the supporting film 3. This avoids in particular having a supporting film of the double-face type (double metallization).

The external/visible side of the module here remains unchanged, thus making it possible to preserve a good appearance and with good mechanical/corrosion resistances. The bare lead frame module is of the conventional/standard type.

The contacts are formed by copper etching or copper sheet punched and laminated on a dielectric substrate. The contacts are treated by a surface coating of the Ni/Cu, Ni/Au or Ni/Pd type or any equivalent.

Thus the invention according to this embodiment consists of adding an antenna or turns to a single-face standard module on the protection for the chip. The method therefore makes provision in advance for carrying out a transfer and conventional connection of the chip by means of standard operations, in particular a connection by soldered wire 15, protection of the chip in particular by coating (drop of resin or drop of resin surmounted where applicable with an insulating stiffener/pellet) or overmoulding or cap or equivalent.

According to one feature of this embodiment, the antenna is produced by printing, in particular by jet of material or jet of conductive ink, where applicable by screen printing or pad printing on the flat part (S) optionally supplemented by a jet of material for connection to the interconnection areas 34A, 34B.

The printing is preferably of the three-dimensional type in order to produce patterns on the various surface levels.

Where applicable, it is possible to use a printing ink comprising conductive particles. They may comprise flakes or nanoparticles. The conductive particles may comprise various metals, Ag, Cu, Au, Al or Ni.

After printing, the ink may be dried in order to eliminate all the solvents and then be polarised. This hardening step makes it possible to achieve the best electrical conductivity. In the case of nanoparticles, the method chosen will enable the particles to achieve sintering. This is possible by means of an infrared oven, a hot-air tunnel, microwave treatment or a pulsed light system.

In order to obtain the desired electrical conductivity and mechanical strength, the printing and the drying operation may be applied several times in order to increase the thickness.

The antenna thus formed makes it possible to provide the module with a contactless interface 2 as the very last operation according to the type of chip available and/or communication range necessary.

This antenna printing may require an insulating bridge 29 covering the turns 4 produced in particular with an insulating ink and a second passage of conductive ink to be printed in order to produce a conductive bridge 31 on top of the insulating bridge in order to connect the inner turn of the antenna 2 to the chip via the interconnection area 34B.

In FIG. 5, the module differs from the previous one in that the conductive interconnection areas (metallisations) 34A, 34B of the module are situated on the reverse side of the substrate (the face opposite to the face carrying the contact pads), here a substrate with two opposite conductive faces. Conductive vias 28 can connect the metallisations 34A, 34B or the like situated on the opposite faces.

Alternatively, the invention may also provide a double face without a conductive via and/or without turns additional to those that are on the protection.

This embodiment differs also from the previous one in that it comprises antenna turns or parts (in the UHF case) extending outside the protection. These antenna parts outside the protection may also be applied to the previous embodiment.

In general terms, in each embodiment, the antenna 2 connected to the radio-frequency chip 7 can be used alone or in combination with an "LC amplification circuit", also referred to as an "RF booster" or relay antenna or passive antenna.

In the case of the antenna used alone, it may be an RF, UHF or UWB design or any type of frequency, in particular ranging from a few MHz up to a few GHz.

Optionally in this FIG. 5, antenna turns 36 may also cover the surface of the module situated at the periphery of the encapsulation or mechanical protection 12 of the chip. These turns 36 may be preformed like the contact pads or formed by printing on any face of the module.

The turns 36 may be etched on the rear face of the module. Where applicable, another insulating bridge on or under these turns 36 may be created, in particular by printing, to make it possible to join an external turn formed on the substrate. These additional turns allow a larger number of turns or a larger surface area for a few turns.

In the example, the inner turn of the association formed by the two series of turns 4, 36 is connected to the area 34B substantially as in FIG. 4. The outer turn 4 of the antenna 2 is connected to an interconnection area 34A. This area 34A is next connected to an inner turn of the turns 36 so as to increase the number of turns of the antenna 2. The outer turn of the turns 36 is connected to the chip by a conductive bridge passing under the turns 36 by means of the pad 26 and conductive vias 28 and area 34C for interconnection to the chip.

Where applicable, the invention may provide an insulating material that may be printed on the module around the protection/encapsulation in order to cover and insulate the residual tracks and any current feeds used in particular for effecting electrolytic depositions.

Advantageously in each case, it is in general possible to provide anti-fraud security against the dismantling of a chip card. A drop of glue may be deposited in the cavity bottom of a card body before the module according to the invention is inserted. The glue necessarily adheres to the antenna 2 and fraudulent extraction of the module from its cavity will cause rupture or damage (difficult to repair) of the antenna 2, which had been printed or produced on the mechanical protection 12.

According to one feature, the interconnection tracks 34A, 34B may already be pre-connected to complementary antenna turns 36 disposed on the insulating substrate. This is because the support 3 may comprise antenna turns complementary to the turns of the three-dimensional antenna 2.

Preferably, the interconnection pads, tracks, areas 34A, 34B, 26 described in the previous embodiments are carried by an insulating substrate. However, the invention also makes provision not to have an insulating substrate, the various interconnection areas being carried or connected together by a protective resin or cap for the chip.

In a third embodiment of the invention, the additional antenna 4 of FIG. 3 or 5 is formed as below. An insulating reinforcing pellet or cap that already comprises antenna tracks or turns is deposited on top of the chip or its coating. Then, secondly, the tracks or turns carried by the pellet or cap are connected to the interconnection areas 34A, 34B resident on the module. The connection may be done by any known means (soldering etc.) but printing is preferred for operational flexibility.

Where applicable, if we wish for the radio-frequency transponder of the module to be intended to function with a relay/passive antenna, it is possible to produce the relay antenna on the module, in particular on top of and/or at the periphery of the mechanical protection and in particular by printing.

According to another embodiment that is not illustrated, the three-dimensional antenna 2 of the previous embodiments again constitutes a relay antenna with respect in particular to a transponder at least partly contained in the mechanical protection 12.

Alternatively, according to an embodiment that is not illustrated, the turns 36 of the module 16 in FIG. 5 or 3 can constitute a passive antenna at the periphery of the module with respect to the transponder formed by the chip 7 and antenna 2. In this case, the antenna 2 would be connected not to the turns 36 of the passive antenna but to the chip 7 as in FIG. 3. And the complementary turns 36 forming a relay antenna would be connected to a capacitor of any form as described previously.

The transponder may be simply a chip connected to an antenna, in particular etched/printed on one face of the chip. The relay antenna may also be produced on the reverse side of the module (the face opposite to that carrying the pads 26) and/or on the mechanical protection 12.

A capacitor connected to the relay antenna can be provided on the module, in particular in the form of a surface-mounted integrated circuit or capacitor plates. The relay antenna can be connected via interconnection areas (similar to 34A, 34B) to a capacitor in the form of an electronic chip disposed for example alongside the chip 7. Alternatively, the areas 34A, 34B can form a capacitor with conductive pads 26 carried by the substrate.

In general terms, the antenna of the radio-frequency transponder intended to function with a relay antenna can be carried either by the chip, or on the insulating substrate.

The three-dimensional antenna may comprise one or more insulating bridges on the turns in order to return an inner turn towards an outer turn or vice versa above or below this insulating bridge.

The following description describes more fully the advantage of the radio-frequency module of the invention having regard to a relay antenna. In a particular embodiment that is not illustrated, in order to increase the contactless communication range, the antenna 2 of the module of any embodiment is preferably electromagnetically coupled to a passive antenna.

The passive antenna may be disposed in a card or passport body or a reader or any radio-frequency device. Where applicable, the antenna is disposed in or on a mobile telephone or electronic personal assistant, in particular in the housing. The passive antenna can be produced for example as a wire encrusted by etching according to an electronic label technology etc.

Whatever the embodiment, with or without relay antenna, the invention can provide forms and/or connections, contact pads or soldering or connection pads so that the module is suitable for being removable or soldered to any electronic device such as a mobile telephone or a personal computer (PDA).

Even on a card body, the module can be adapted so as to be detachable with in particular a repositionable adhesive placed on the bonding surface. Thus the substrate may not project beyond the surface of the mechanical protection or coating. It may have a reduced format of the new 3FF and 4FF standards. It may be adapted with fixing lugs in order to be surface mounted on a printed circuit.

The invention offers a better compromise between reliability, module appearance, flexibility of manufacture and cost compared with a double-face film of conductive vias and completely etched antenna.

A standardised module for production that can be stored in a generic form or model and will be personalised by printing the antenna adapted to the distinct characteristics of each chip. The use of the double-interface module with antenna will allow a significant increase in the data output for the personalisation step and therefore reduce costs.

The design of the printed antenna enables the antenna to be adjusted at the last moment: if for example a batch of chips has an internal resistance different to a standardised one provided for production, the invention makes it possible to change the number of turns on the antenna so as to preserve the same resulting resonant frequency.

Another advantage of the invention is the fact that a standard double-interface module can be connected to an antenna embedded in a card body as in the prior art with connection areas updated or being accessible from the outside of the card body or during insertion. An interconnection of the antenna of the card body with the module can be done by any means in particular with a silver glue or flexible conductive pins.

The invention claimed is:

1. A method for manufacturing an electronic module, said electric module fully supporting electrical interconnection areas and comprising an integrated-circuit chip connected to an antenna, said method comprising the steps of:
   producing a module comprising electrical interconnection areas, a chip connected to the interconnection areas and protection covering at least the chip and partly said interconnection areas, and a radio-frequency antenna connected to the chip, said protection comprising an insulating material,
   wherein the method further comprises a step of producing all or part of the antenna or its tracks for connection to the interconnection areas in three dimensions directly on the protection.

2. The method according to claim 1, wherein the antenna is produced by printing, by jet of material or conductive ink jet.

3. The method according to claim 2, wherein said antenna extends partly over the protection at a first level and partly over at least one flank of the protection as far as the interconnection areas situated at a second level different from the first level.

4. The method according to claim 3, wherein said interconnection areas are carried by an insulating substrate.

5. The method according to claim 4, wherein the interconnection areas are connected to complementary antenna turns disposed on the insulating substrate.

6. The method according to claim 5, wherein the interconnection areas are connected or constitute antenna turns complementary to the three-dimensional antenna.

7. The method according to claim 6, wherein the three-dimensional antenna constitutes a relay antenna with respect to a transponder at least partly contained in the protection.

8. The method according to claim 7, wherein the antenna of the transponder is carried either by the chip or on the insulating substrate.

9. The method according to claim 4, wherein the insulating substrate carries electrical contact pads on an external face opposite to the coating.

10. The method according to claim 1, wherein the three-dimensional antenna comprises an insulating bridge on the turns in order to return an inner turn towards an outer turn over said insulating bridge.

11. A radio-frequency device comprising the module manufactured according to claim 1.

12. The method according to claim 1, wherein the protection comprises a resin material.

13. The method according to claim 1, wherein the insulating material has a thickness of at least 0.2 mm.

* * * * *